(12) United States Patent
Doris et al.

(10) Patent No.: US 7,388,257 B2
(45) Date of Patent: Jun. 17, 2008

(54) MULTI-GATE DEVICE WITH HIGH K DIELECTRIC FOR CHANNEL TOP SURFACE

(75) Inventors: Bruce B. Doris, Brewster, NY (US); Oleg Gluschenkov, Poughkeepsie, NY (US); Ying Zhang, Yorktown Heights, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 349 days.

(21) Appl. No.: 10/711,200

(22) Filed: Sep. 1, 2004

(65) Prior Publication Data

US 2006/0043421 A1   Mar. 2, 2006

(51) Int. Cl.
*H01L 27/01*   (2006.01)
(52) U.S. Cl. ............ 257/347; 257/314; 257/315; 257/E21.415; 257/E21.444
(58) Field of Classification Search ........ 257/347–349, 257/314–318, 365–368; 438/157, 257–259, 438/281–283
See application file for complete search history.

(56) References Cited

U.S. PATENT DOCUMENTS

| | | | |
|---|---|---|---|
| 5,940,716 A | 8/1999 | Jin et al. | |
| 5,981,356 A | 11/1999 | Hsueh et al. | |
| 6,080,637 A | 6/2000 | Huang et al. | |
| 6,093,621 A | 7/2000 | Tseng | |
| 6,583,060 B2 | 6/2003 | Trivedi | |
| 7,125,776 B2* | 10/2006 | Achuthan et al. | 438/283 |
| 2003/0151077 A1* | 8/2003 | Mathew et al. | 257/250 |
| 2004/0075122 A1* | 4/2004 | Lin et al. | 257/288 |
| 2004/0235300 A1* | 11/2004 | Mathew et al. | 438/689 |

* cited by examiner

*Primary Examiner*—Dung A. Le
(74) *Attorney, Agent, or Firm*—Joseph P. Abate; Greenblum & Bernstein P.L.C.

(57) ABSTRACT

A multi-gate device has a high-k dielectric layer for a top channel of the gate and a protective layer for use in a finFET device. The high-k dielectric layer is placed on the top surface of the channel of the finFET and may reduce or eliminate silicon consumption in the channel. The use of the high-k dielectric layer on the top surface reduces hysteresis and mobility degradation associated with high-k dielectrics. The protection layer may protect the high-k dielectric layer during an etching process.

15 Claims, 8 Drawing Sheets

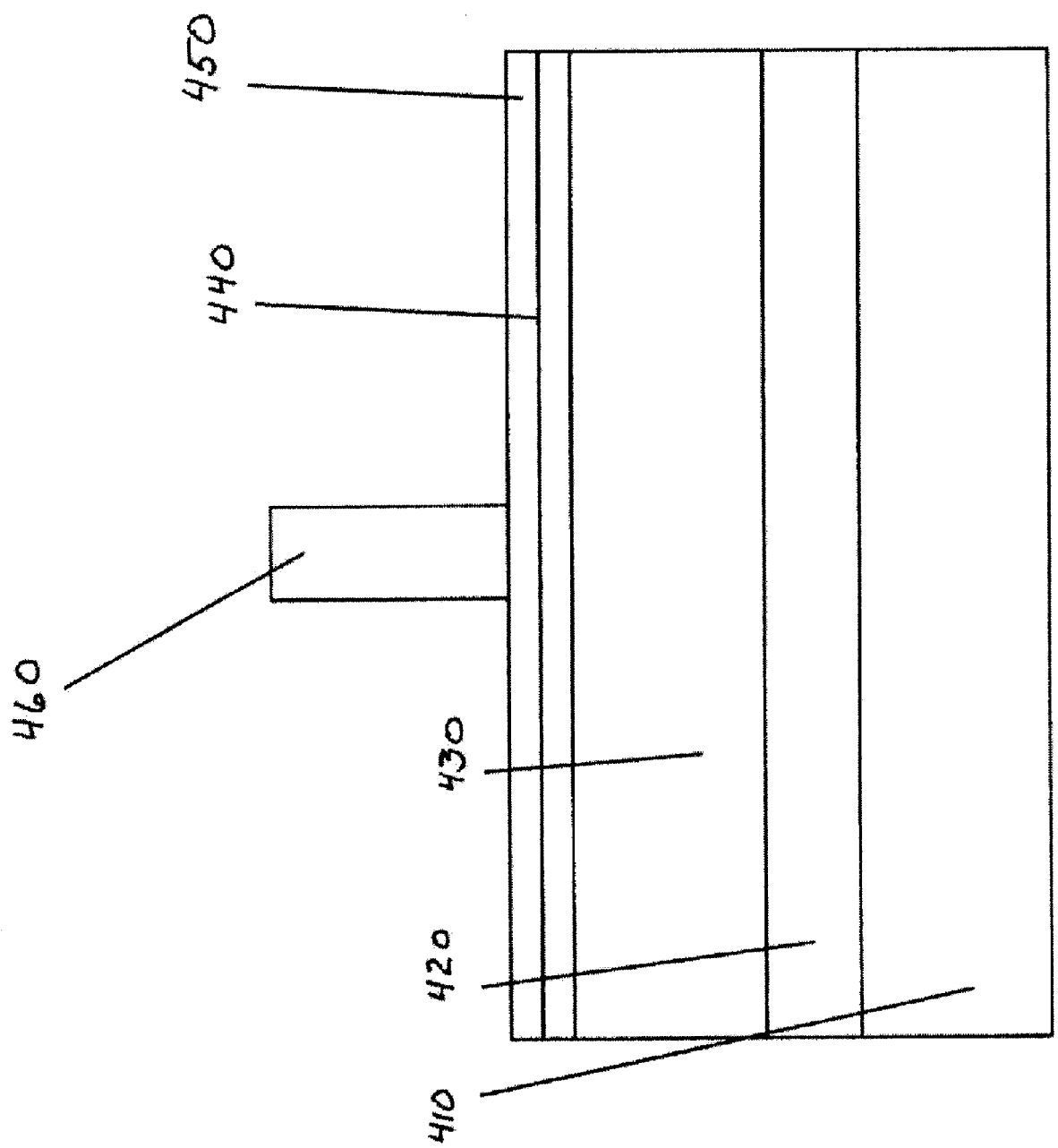

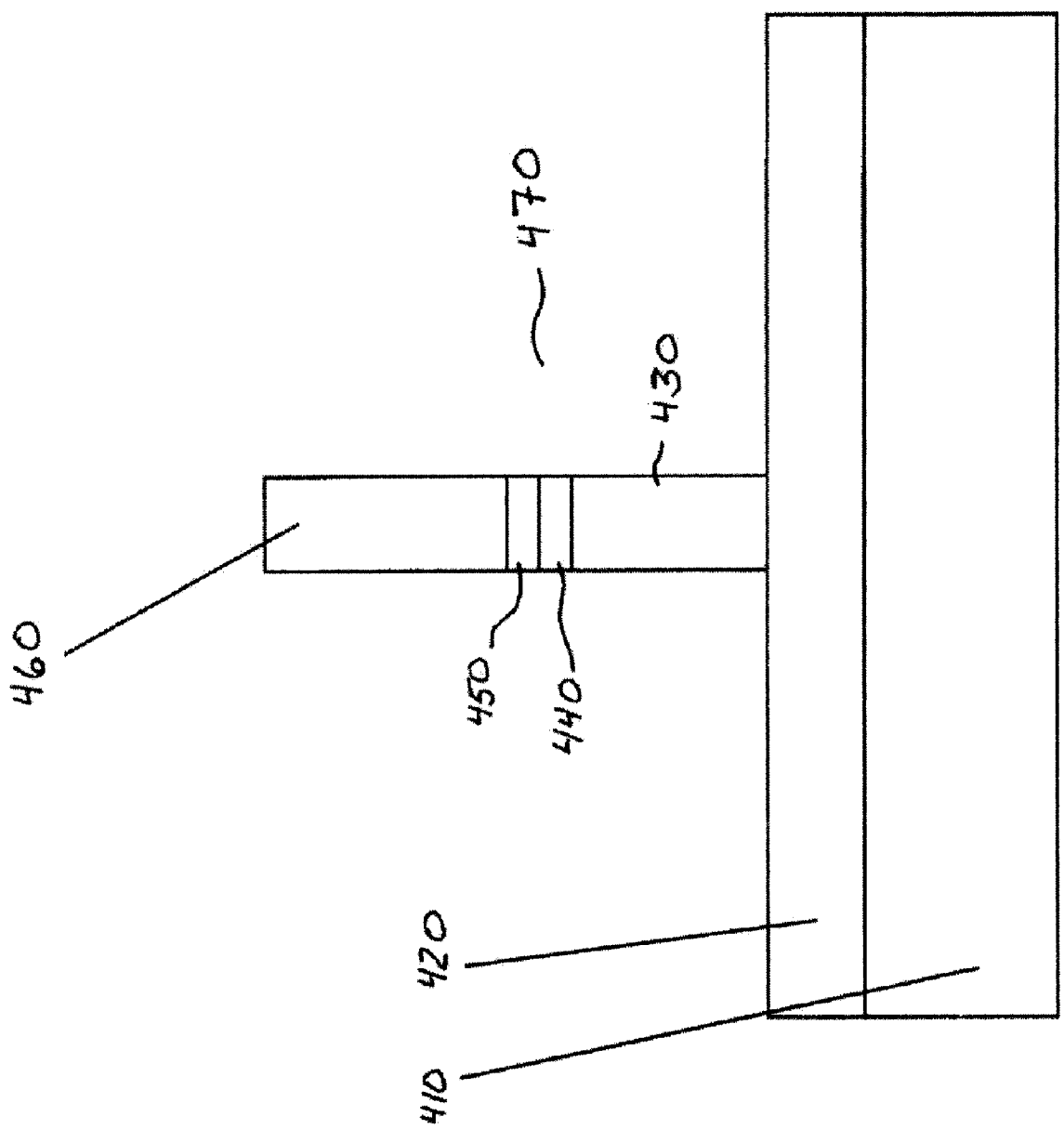

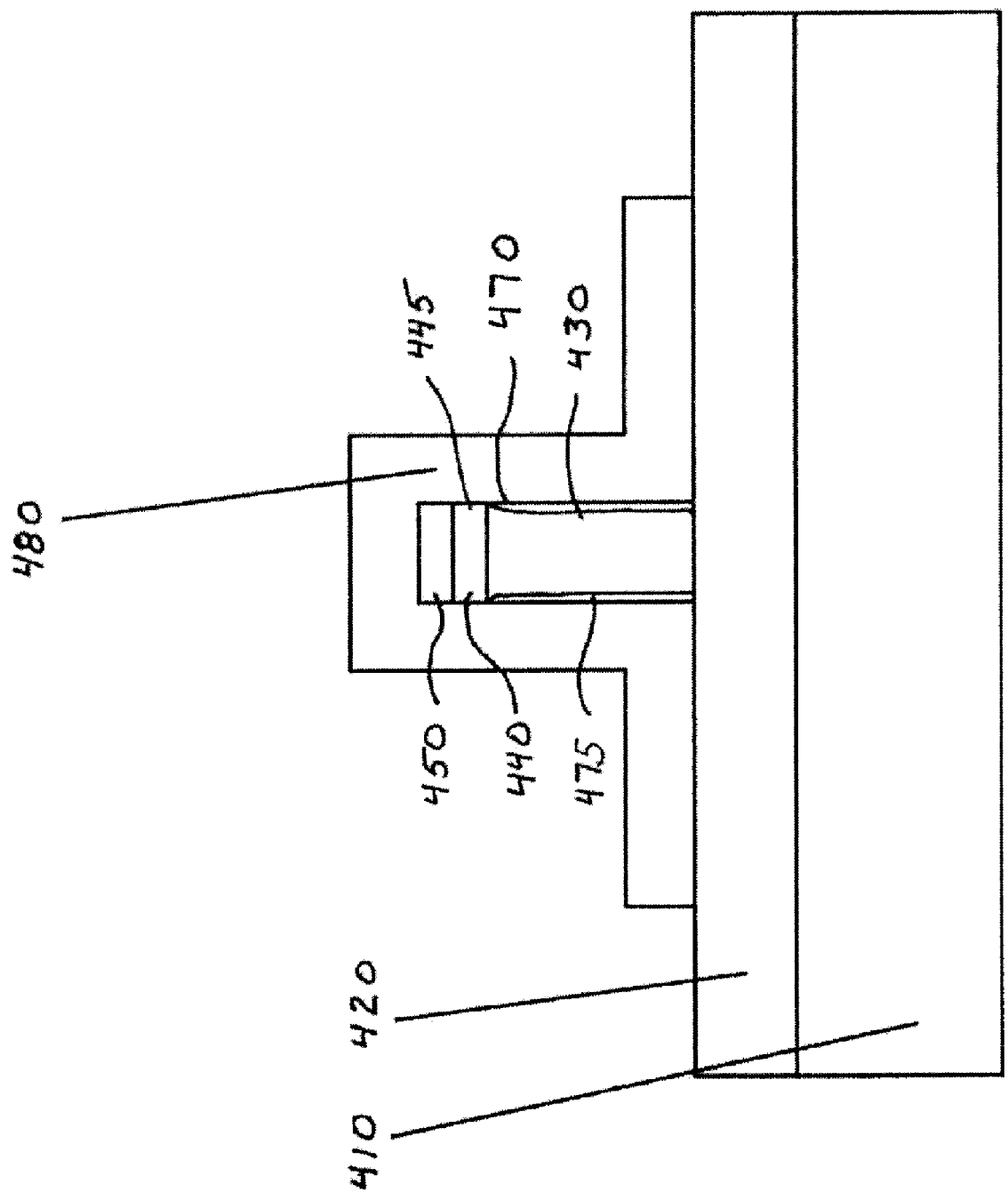

MULTI-GATE DEVICE WITH HIGH K DIELECTRIC FOR CHANNEL TOP SURFACE

BACKGROUND OF INVENTION

The invention relates to a multi-gate device, and, more particularly, with a multi-gate device with high k dielectric for top channel.

An integrated circuit (IC) device may contain field effect transistors (FET). One such type of FET is a metal-oxide semiconductor FET, or MOSFET. MOSFETs have been scaled to smaller sizes to provide more room, and performance in an IC, thereby providing greater functionality in the IC.

One type of MOSFET which has been developed to improve performance is a finFET. A finFET is a MOSFET in which a portion of the silicon has been etched into a thin, "fin"-like shape. That is, a narrow channel of silicon is formed on a wafer, such as a silicon oxide insulating (SOI) wafer. A gate electrode is applied to the "fin" such that it wraps around on two or more sides. This results in a various number gate devices. For example, a gate electrode wrapped around three sides of the fin is a tri-gate device.

FIG. 1 illustrates a top view of a finFET 100 located on a wafer 110, such as a silicon oxide insulator (SOI) wafer. The finFET 100 includes a source 120, a drain 130 and a channel, or "fin," 140. As seen, the fin 140 is relatively thinner than either of the source 120 and the drain 130. The source 120, drain 130, and fin 140 are made of silicon and are patterned on the SOI wafer 110 using known pattern techniques. A gate electrode 150 is placed over the fin channel to complete the finFET.

Tri-gate type finFETs, such as the finFET 100, generally require a thin gate oxide for the top surface of the channel of the fin. Such a thin gate oxide provides improved gate control and current drive on the top channel.

Conventional finFET devices use an oxide hard mask to prevent silicon consumption during the etching of the gate stack (that is, the fin 140), especially silicon consumption at the source drain extension region 140 of the finFET. However, silicon consumption still occurs, and may be particularly problematic for the thin gate oxides of the fin, due to the thinness of the layer, and the fact that the gate electrode material and the fin are the same material.

FIG. 2 illustrates a side view of a portion of the finFET 100, showing the gate 150 and the fin 140. However, as the top gate oxide is thin, silicon consumption in fin 140 during the gate stack etching process may cause problems with the performance of the finFET. This silicon consumption is illustrated at edges 145 of fin 140.

SUMMARY OF INVENTION

According to an exemplary embodiment of the invention, a transistor is provided including a stack comprising a silicon on insulator layer having a plurality of channels, a silicon oxide insulation layer adjacent the silicon on insulator layer and a dielectric layer adjacent the silicon oxide insulation layer, and a gate electrode, wherein the gate electrode covers a portion of the stack, wherein at least one channel has a gate configuration that is different than the remaining channels.

According a further exemplary embodiment, the invention provides a transistor having a stack comprising a silicon on insulation layer, a silicon oxide insulation layer on silicon on insulation layer, a dielectric layer on the silicon oxide insulation layer, wherein the dielectric layer is a high-k dielectric material and a protection layer on the dielectric layer, and a gate electrode covering a portion of the stack.

According to a further embodiment, the invention provides a method for providing a transistor including the steps of providing a silicon on insulator layer, providing a silicon oxide insulation layer, providing a dielectric layer, removing at least a portion of the silicon oxide insulation layer and the dielectric layer to form a gate stack and forming a gate electrode, wherein the gate electrode covers a portion of the gate stack.

BRIEF DESCRIPTION OF DRAWINGS

FIG. 7 illustrates a side cross-sectional view of a semiconductor substrate with a form resist according to an embodiment of the invention;

FIG. 8 illustrates a side cross-sectional view of a semiconductor substrate with an etched multi-gate stack according to an embodiment of the invention; and FIG. 9 illustrates a side cross-sectional view of a semiconductor substrate with a multi-gate according to an embodiment of the invention.

DETAILED DESCRIPTION

The invention is directed to, for example, using a high-k dielectric layer as a protection layer for the top surface of a tri-gate device, such as in a finFET. As is known in the art, a high-k dielectric is a dielectric material with a dielectric constant "k" which is higher than the dielectric constant of silicon oxide (i.e., higher than approximately 3.9). Examples of such high-k dielectrics include, but are not limited to, hafnium oxide ($HfO_2$), hafnium silicate, ($HfSiO_4$), zirconium oxide, aluminum oxide and other materials.

Figure 1:
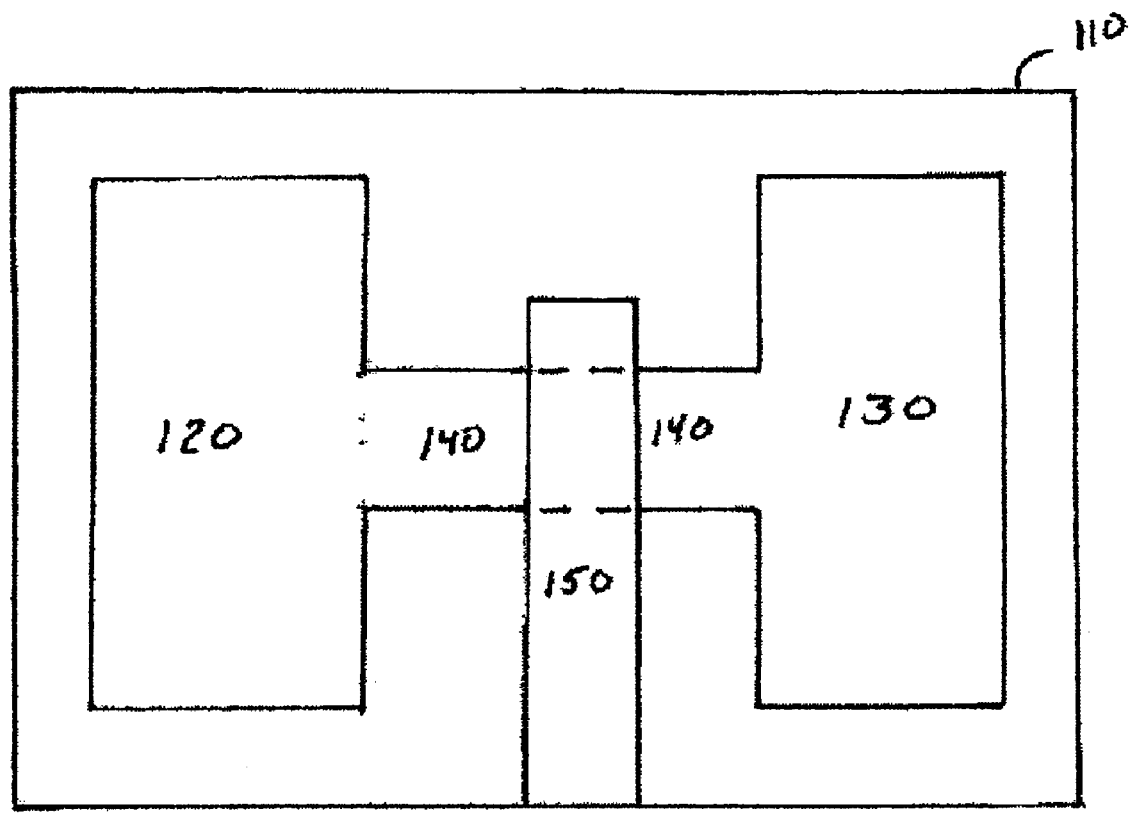
FIG. 1 illustrates a conventional finFET in a conventional embodiment.
Figure 3:
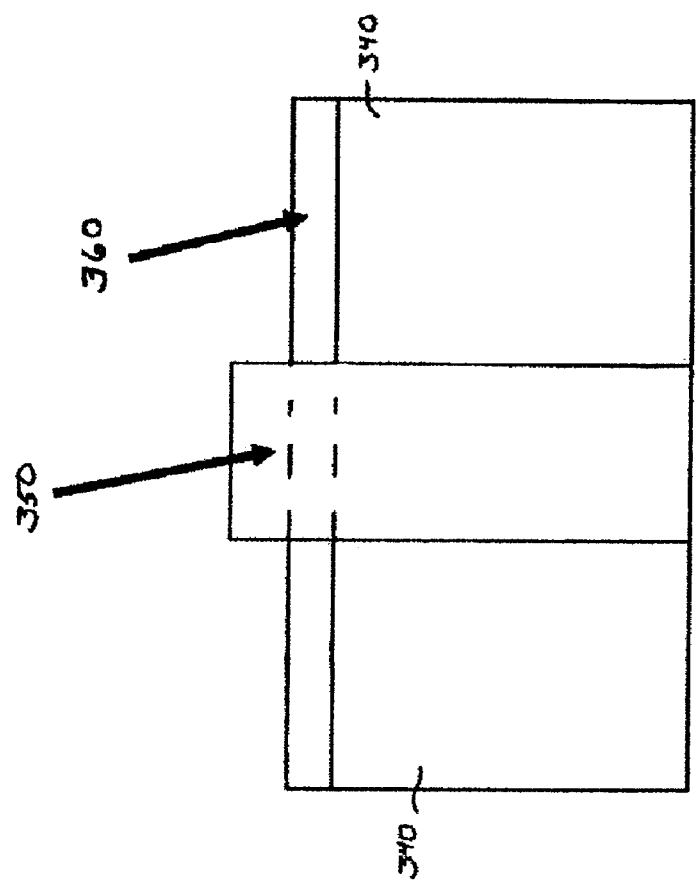
FIG. 3 illustrates a side view of a portion of a gate device according to an embodiment of the invention.
Figure 2:
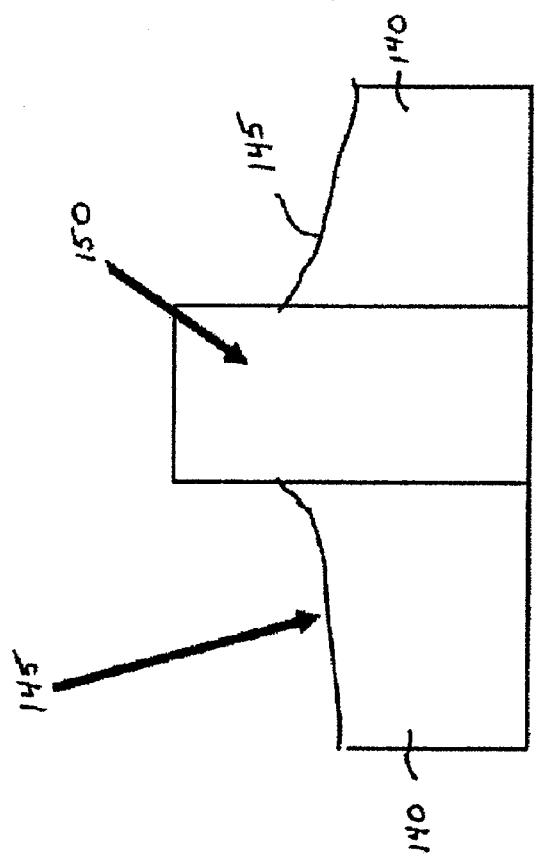
FIG. 2 illustrates a side view of a fin portion of the finFET of FIG. 2.

FIG. 3 illustrates a transistor according to an embodiment of the invention. The transistor 300 in FIG. 3 is shown as a portion of a device on an IC, such as a finFET. The transistor 300 has a fin or channel 340 with a gate electrode 350 wrapped around the fin 340. A protection layer 360 is located on top of fin 340, but underneath gate electrode 350. The protection layer 360 may reduce or eliminate silicon consumption during the etching of the fin 340.

The process for making a fin 340 in a finFET device according to an embodiment of the invention, and the role played by the protection layer 360, will now be described in greater detail with reference to FIGS. 4-9. While the process will be described with reference to a gate in a finFET device, it is understood that the process may be used with other devices as well.

Figure 4:
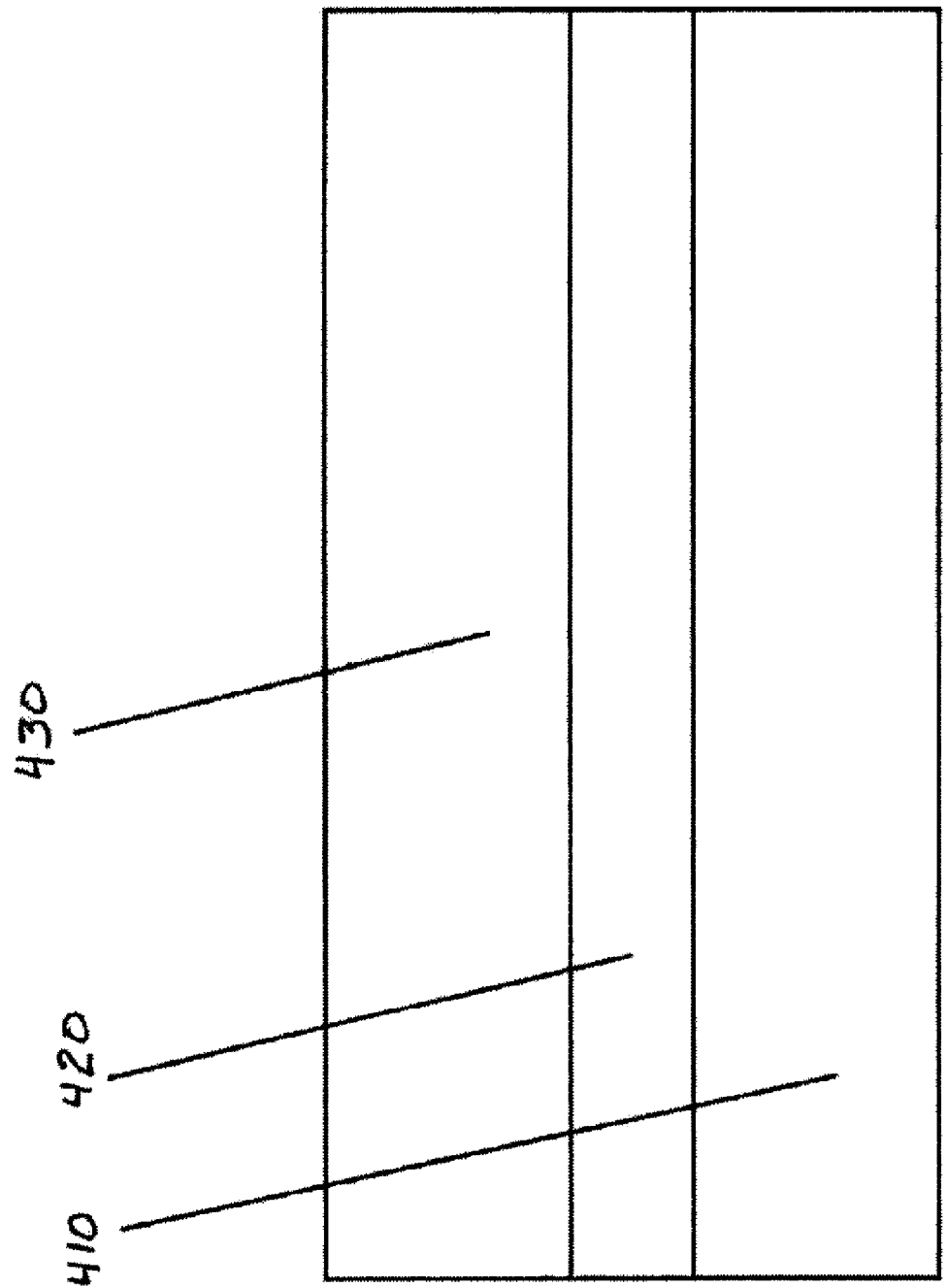
FIG. 4 illustrates a side cross-sectional view of a semiconductor substrate according to an embodiment of the invention.

FIG. 4 illustrates a side cross-sectional view of a semiconductor substrate according to an embodiment of the invention. A substrate wafer, such as an SOI wafer, is provided. The substrate consists of silicon on insulating layer 430, buried oxide layer 420 and handle wafer 410. By way of example, the thickness of the SOI layer 430 may be between about 500 Å and about 1000 Å, but is not limited to this thickness range.

Figure 5:
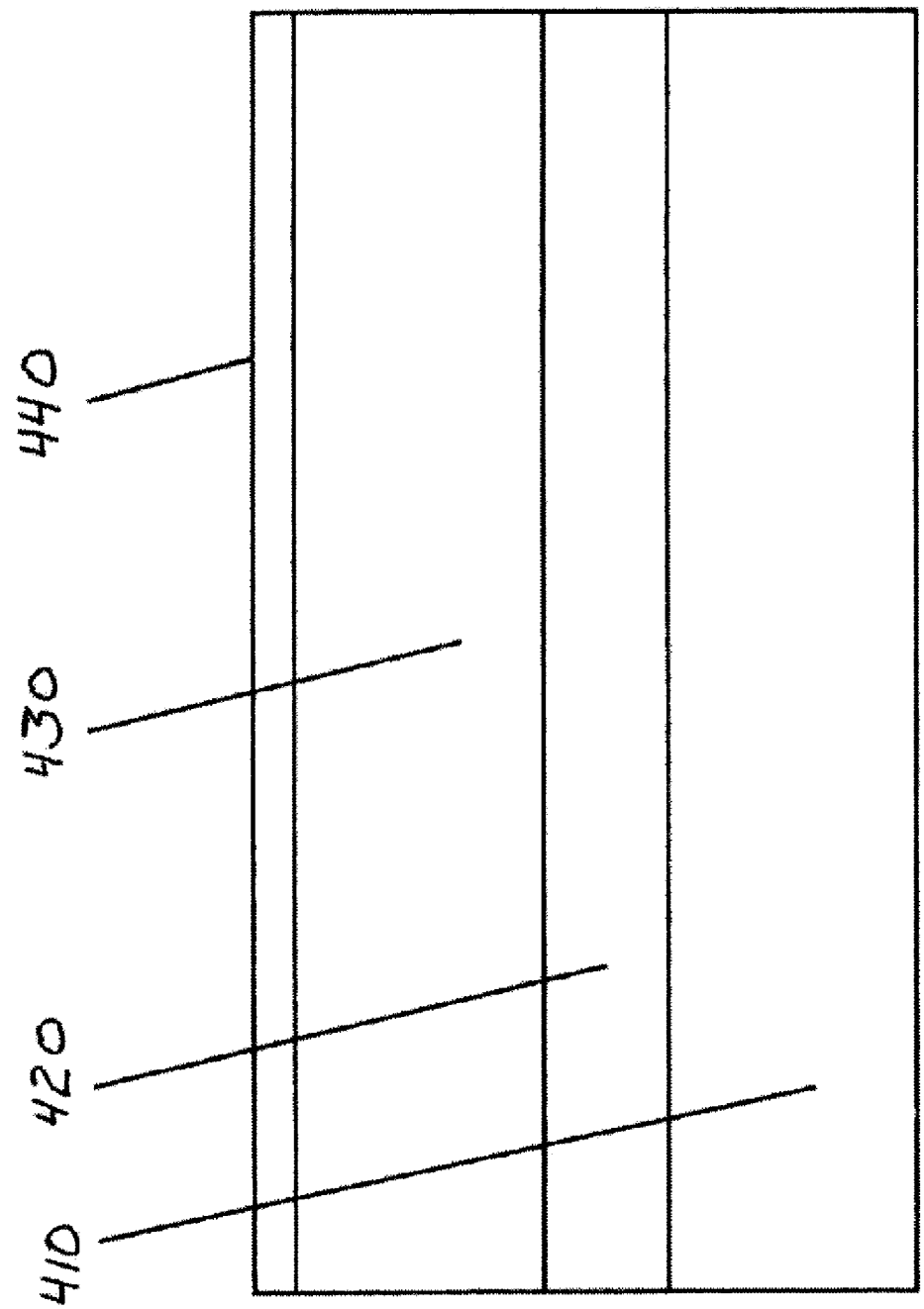
FIG. 5 illustrates a side cross-sectional view of a semiconductor substrate with a dielectric layer according to an embodiment of the invention.

FIG. 5 illustrates a side cross-sectional view of a semiconductor substrate with a dielectric layer according to an embodiment of the invention. A dielectric layer 440 is provided on SOI layer 430. According to an embodiment of the invention, where dielectric layer 440 is a high-k dielectric. The surface of SOI layer 430 may be pre-cleaned and an interfacial or base oxide layer then may be grown, as is standard in processes for high-k materials. Placing a high-k dielectric layer on the SOI layer 430 may help prevent silicon consumption when the resulting device is in use. High-k layers, like $HfSiO_x$ and $HfO_2$ are known to be resistant to gate electrode etch chemistries. Thus, the gate stack etch is less likely to consume silicon. The high-k layer also acts as a gate dielectric for the top of the tri-gate device.

According to an embodiment of the invention, a dielectric layer 440 may be formed of a high-k dielectric in a combination of two layers (not shown). A base layer, such as an oxide or a nitride oxide layer is very thin, and may be referred to as "interfacial layer." A high-k material film is placed on top of the base layer. A high K material may include, but is not limited to hafnium oxide, hafnium silicate, zirconium oxide, aluminum oxide and other materials. The high-k dielectric film and that film may be thicker than that of standard dielectric materials due to a higher dielectric content relative to other dielectrics. The typical high-k materials have dielectric constants four to five times higher than silicon dioxide. Thus, for the same equivalent thickness of silicon dioxide, the high-k dielectric layer may be 4-5 time thicker. Thus, a thicker material for the same kind of electrical oxide thickness is permitted. Use of a thicker material may provide improved performance with respect to gate leakage reduction.

Figure 6:
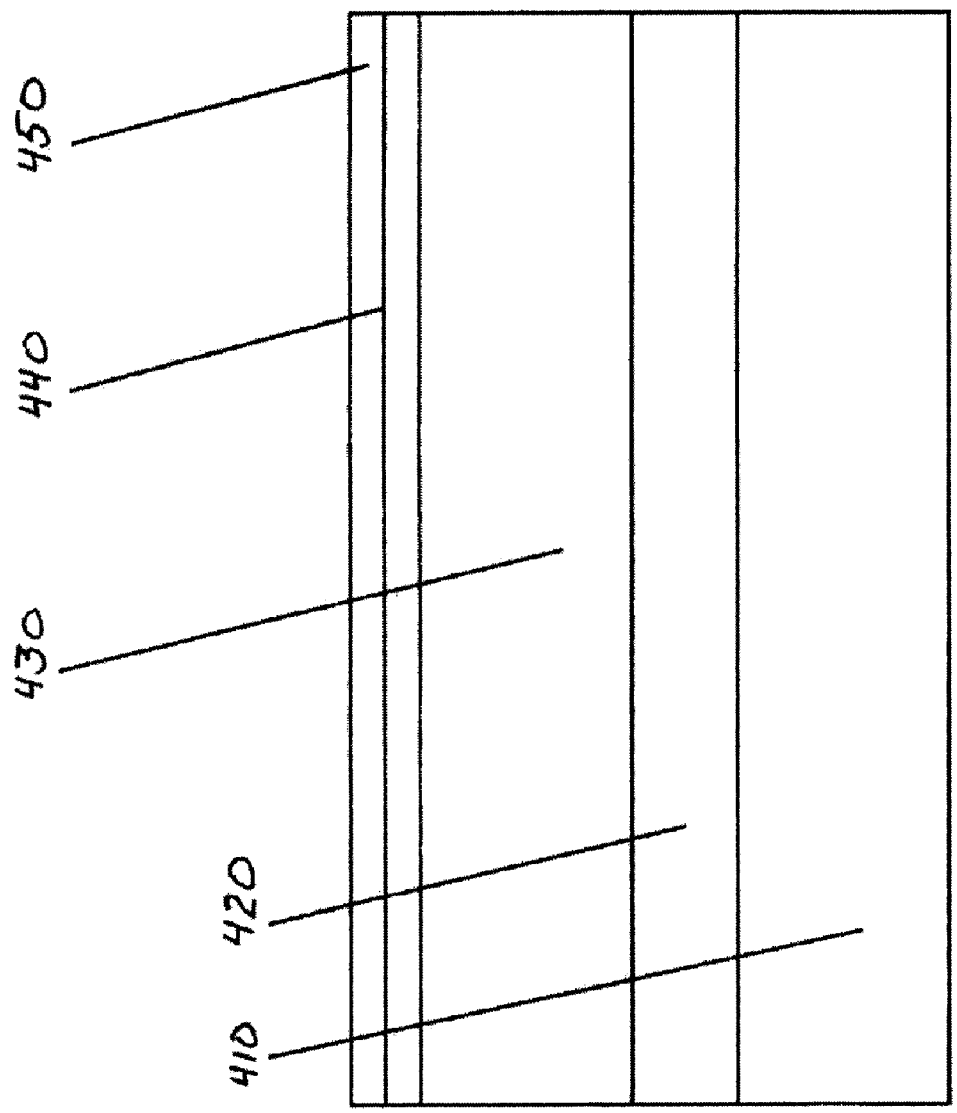
FIG. 6 illustrates a side cross-sectional view of a semiconductor substrate with a protection layer according to an embodiment of the invention.

FIG. 6 illustrates a side cross-sectional view of a semiconductor substrate with a protection layer according to an embodiment of the invention. A protection layer 450 is provided on high dielectric layer 440. Protection layer 450 may be formed of a poly-silicon (SiO2), a metallic material, or other materials. The protection layer 450 may have a thickness of between about 10 nanometers and about 15 nanometers, but is not limited to this thickness range.

Protection layer 450 may be used to protect the dielectric layer 440 during the etching process. According to an embodiment of the invention, the protection layer 450 is etched in an etching process, the dielectric layer 440 is etched in another etching process, and the SOI layer 430 is etched in still a further etching process.

Removing a resist, such as resist image 460 described in FIG. 7 below, directly from the dielectric layer 440 may result in some damage to that dielectric, including a high-k dielectric material. High-k dielectric materials may be a delicate material that is susceptible to damage when removing items, such as when removing a resist. Placing a protection layer 450 on the dielectric layer 440 may protect the high-k dielectric in dielectric layer 440. The protection layer 450 may be made of a relatively more durable material, such as polysilicon or metal. The protection layer 450 serves as the bottom portion of the gate electrode for the top channel of the tri-gate device.

FIG. 7 illustrates a side cross-sectional view of a semiconductor substrate with a resist image according to an embodiment of the invention. A resist image 460 is placed on protective layer 450. The resist image 460 is placed so that etching will produce a fin and a top portion of the gate stack consisting of a gate dielectric stack formed by the first interfacial layer, then the high-k layer and the thin metal or polysilicon layer.

FIG. 8 illustrates a side cross-sectional view of a semiconductor substrate with an etched fin according to an embodiment of the invention. As illustrated, resist image 460 causes a fin and portion of a gate stack 470 to be formed due to the etching process. The fin and portion of a gate stack 470 includes the protection layer 450, the dielectric layer 440, and the SOI layer 430. In this embodiment, the SOI layer 430 is etched down to the buried oxide layer 420. However, it is understood that other layers may be included, and that the etching may be performed to various depths based on the desired end device.

FIG. 9 illustrates a side cross-sectional view of a semiconductor substrate with a multi-gate according to an embodiment of the invention. Resist image 460 has been removed using conventional methods. A hard mask (not shown) may also be removed if used. Gate electrode 480 has been provided on fin and portion of a gate stack 470. In the embodiment of FIG. 9, gate electrode 480 is shown to cover the fin and portion of a gate stack 470 on for the top channel of the tri-gate. However, it is understood that the gate electrode 480 may cover the fin and portion of a gate stack on more or on fewer sides, as desired. Further, one channel may have a different gate configuration that the other channels. By way of example, one channel 445, such as the top channel, may have a first thickness that is greater than the thickness of the remaining channels 475. By way of another example, one channel 445, such as the top channel, may have a different gate dielectric than the remaining channels 475. The top channel 445 may be made of a high-k dielectric, and the gate dielectric of the remaining channels 475 may be different material, such as silicon dioxide, nitride oxide, a silicon oxide that has undergone a plasma nitridation process, or other similar materials.

The gate electrode 480 may be made of any material commonly used for gate electrodes in IC devices, such as polysilicon, metals and other materials with electrical current conductivity properties. Problems often associated with high-k dielectrics, such as hysteresis and current mobility degradation, may be reduced or eliminated as the high-k dielectric is present on only a relatively small portion of the surface channel or fin, such as at the top surface of the channel. The high-k dielectric may reduce or eliminate silicon consumption on the top portion of the fin during the etching process.

While the invention has been described in terms of exemplary embodiments, those skilled in the art will recognize that the invention can be practiced with modifications and in the spirit and scope of the appended claims.

What is claimed is:

1. A transistor comprising:
    a stack comprising:
        a silicon on insulator layer having a plurality of channels;
        a silicon oxide insulation layer adjacent the silicon on insulator layer; and
        a dielectric layer adjacent the silicon oxide insulation layer; and
    a gate electrode,
    wherein the gate electrode covers a portion of the stack;
    wherein at least one channel has a gate configuration that is different than remaining channels of the plurality of channels.

2. The transistor according to claim 1, wherein the at least one channel has a first thickness that is greater than the thickness of the remaining channels.

3. The transistor according to claim 1, wherein the at least one channel has a different gate dielectric than the remaining channels.

4. The transistor according to claim 3, wherein the gate dielectric of the at least one channel is a high-k dielectric, and the gate dielectric of the remaining channels is a material selected from the group comprising silicon dioxide, nitride oxide, and a silicon oxide that has undergone a plasma nitridation process.

5. The transistor according to claim 1, wherein the stack further comprises a protection layer located between the dielectric layer and the gate electrode.

6. The transistor according to claim 5, wherein the protection layer is a metal.

7. The transistor according to claim 5, wherein the protection layer is a thin polysilicon.

8. The transistor according to claim 1, wherein the dielectric layer is a high-k dielectric material.

9. The transistor according to claim 1, wherein the stack and the gate electrode are incorporated into a finFET device.

10. The transistor according to claim 1, wherein the stack is arranged such that the silicon on insulator layer, the silicon oxide insulation layer, and the dielectric layer are located one on top of the other.

11. A transistor comprising:
   a stack comprising:
      a silicon on insulator layer;
      a silicon oxide insulation layer on the silicon on insulator layer;
      a dielectric layer on the silicon oxide insulation layer, wherein the dielectric layer is a high-k dielectric material; and
      a protection layer on the dielectric layer; and
   a gate electrode covering a portion of the stack.

12. The transistor according to claim 11, wherein the protection layer is a metal.

13. The transistor according to claim 11, wherein the protection layer is a polysilicon.

14. The transistor according to claim 11, wherein the stack and the gate electrode are incorporated into a finFET device.

15. The transistor according to claim 11, wherein the stack is arranged such that the silicon on insulator layer, the silicon oxide insulation layer, and the dielectric layer are located one on top of the other.

* * * * *